United States Patent
Park et al.

(10) Patent No.: US 8,533,641 B2
(45) Date of Patent: Sep. 10, 2013

(54) GATE ARRAY ARCHITECTURE WITH MULTIPLE PROGRAMMABLE REGIONS

(75) Inventors: Jonathan C Park, San Jose, CA (US); Salah M Werfelli, Morgan Hill, CA (US); WeiZhi Kang, Kelantan (MY); Wan Tat Hooi, Perak (MY); Kok Siong Tee, Penang (MY); Jeremy Jia Jian Lee, Perak (MY)

(73) Assignee: Baysand Inc., San Jose, CA (US)

( * ) Notice: Subject to any disclaimer, the term of this patent is extended or adjusted under 35 U.S.C. 154(b) by 32 days.

(21) Appl. No.: 13/269,545

(22) Filed: Oct. 7, 2011

(65) Prior Publication Data

US 2013/0087834 A1   Apr. 11, 2013

(51) Int. Cl.
*G06F 17/50* (2006.01)

(52) U.S. Cl.
USPC .................. 716/54; 716/50; 716/53; 716/55

(58) Field of Classification Search
USPC .......................................... 716/50, 53, 54, 55
See application file for complete search history.

(56) References Cited

U.S. PATENT DOCUMENTS

| | | | |
|---|---|---|---|
| 4,668,972 A | 5/1987 | Sato | |
| 4,816,887 A | 3/1989 | Sato | |
| 4,910,417 A | 3/1990 | El Gamal | |
| 5,038,192 A | 8/1991 | Bonneau | |
| 5,289,021 A | 2/1994 | El Gamal | |
| 5,341,041 A | 8/1994 | El Gamal | |
| 6,194,912 B1 | 2/2001 | Or-Bach | |
| 6,617,621 B1 | 9/2003 | Gheewala | |
| 6,930,511 B2 | 8/2005 | Or-Bach | |
| 6,985,012 B2 * | 1/2006 | Or-Bach | 326/41 |
| 7,463,062 B2 | 12/2008 | Or-Bach | |
| 7,870,513 B2 | 1/2011 | Chua | |
| 2008/0116932 A1 * | 5/2008 | Wu et al. | 326/47 |

* cited by examiner

*Primary Examiner* — Thuan Do
*Assistant Examiner* — Brian Ngo
(74) *Attorney, Agent, or Firm* — Useful Arts IP

(57) ABSTRACT

Systems and methods are disclosed for forming a custom integrated circuit (IC) with a first fixed (non-programmable) region on a wafer with non-customizable mask layers, wherein the first fixed region includes multiplicities of transistors and a first interconnect layer and a second interconnect layer above the first interconnect layer which form base cells; and a programmable region above the first fixed region with customizable mask layers, wherein at least one mask layer in the programmable region is coupled to the second interconnect layer which provides electrical access to all transistor nodes of the base cells and wherein the programmable region comprises a third interconnect layer coupled to the customizable mask layers to customize the IC. A second fixed region may be formed above the programmable region to provide multiple fixed regions and reduce the number of required masks in customizing the custom IC.

19 Claims, 14 Drawing Sheets

| | |
|---|---|
| Additional Inteconnect Layers (270) | Fixed Region (320) |
| Metal 6 (261) | |
| Via 5 (252) | |
| Metal 5 (251) | Programmable Region (310) |
| Via 4 (242) | |
| Metal 4 (241) | |
| Via 3 (232) | |
| Metal 3 (231) | |
| Via 2 (222) | |
| Metal 2 (221) | Fixed Region (300) |
| Via 1 (212) | |
| Metal 1 (211) | |
| Contact (205) | |
| Gate Electrode (203) | |
| Diffusion (202) | |
| Substrate (201) | |

Additional Inteconnect Layers (270)
Metal 6 (261)
Via 5 (252)
Metal 5 (251)
Via 4 (242)
Metal 4 (241)
Via 3 (232)
Metal 3 (231)
Via 2 (222)
Metal 2 (221)
Via 1 (212)
Metal 1 (211)
Contact (205)
Gate Electrode (203)
Diffusion (202)
Substrate (201)

| Additional Interconnect Layers (270) | | |
|---|---|---|
| Metal 6 (261) | Fixed Region (320) | |
| Via 5 (252) | | |
| Metal 5 (251) | | |
| Via 4 (242) | | |
| Metal 4 (241) | Programmable Region (310) | |
| Via 3 (232) | | |
| Metal 3 (231) | | |
| Via 2 (222) | | |
| Metal 2 (221) | Fixed Region (300) | |
| Via 1 (212) | | |
| Metal 1 (211) | | |
| Contact (205) | | |
| Gate Electrode (203) | | |
| Diffusion (202) | | |
| Substrate (201) | | |

| Variable Programmable Region (890) | | |
|---|---|---|
| | Programmable Region (810) | Fixed Region (800) |
| Additional Interconnect Layers (280) | | |
| Metal 4 (241) | | |
| Via 3 (232) | | |
| Metal 3 (231) | | |
| Via 2 (222) | | |
| Metal 2 (221) | | |
| Via 1 (212) | | |
| Metal 1 (211) | | |
| Contact (205) | | |
| Diffusion & Gate Electrode (202) | | |
| Substrate (201) | | |

FIG. 9

GATE ARRAY ARCHITECTURE WITH MULTIPLE PROGRAMMABLE REGIONS

BACKGROUND

This invention relates to a custom semiconductor integrated circuit device.

Today's complex and highly integrated Application Specific Integrated Circuit (ASIC) or System On Chip (SoC) may contain multiplicities of reusable intellectual properties (IPs) such as central processing units (CPUs), memories, high-speed transceivers and other full-custom or semi-custom functional blocks, among others. These IP blocks may be independently designed and implemented with a full-custom methodology or a semi-custom methodology such as standard cell technology or gate array technology with potentially more than two metal layers and via layers. For example, one common functional block found in an ASIC or a SoC design may be a RAM block. The RAM blocks may be a full-custom design or metal programmable design and may potentially contain three or more metal and via layers. It is also very common that today's ASIC or SoC may contain more than 5 or 6 metal layers and up to 10 metal layers, depending on the complexity of the designs.

One well known and commonly used approach in making highly integrated ASICs or SoCs is standard cell technology. This technology may provide a high degree of flexibility since all layers (active and interconnect layers) are completely customizable. As a result, the standard cell approach often achieves the most optimized die size, the highest performance, and the easiest integration of IPs. However, in standard cell technology, each layer requires a different mask to project a pattern on the silicon wafer to create an integrated circuit and in today's advanced IC fabrication process nodes (e.g. 45 nm), the cost of masks may easily exceed over a million dollars per mask set. Hence, standard cell technology is becoming unsuitable for the realization of many ASIC or SoC in terms of time and cost.

To overcome the shortcomings of standard cell technology, particularly high mask cost and long manufacturing time for ASICs or SoCs, metal programmable technologies such as gate array and structured ASIC technology have been suggested. The advantages of metal programmable technologies may include reduced manufacturing time and mask cost since there may be a portion of the fixed mask layers that is design independent and only metal or via layers need to be customized to create an ASIC or SoC. In metal programmable technology, the multiplicities of base cell may be in non-programmable layers (e.g. fixed region) and the customization of the base cell may be only performed by metal or via layers. Additionally, the ASIC or SoC devices using metal programmable technology may contain multiplicities of IP blocks which may already contain many metal layers that may be non-customizable since these metal layers are intrinsic parts of the IP blocks and may not be modified when they are integrated into an ASIC or a SoC.

FIG. 1A illustrates an exemplary stack of layers which may be used to manufacture an integrated circuit 100 using traditional gate array technology. Fixed region 200 may contain substrate layer 201, diffusion layer 202, and gate electrode layer 203 to form P and N type MOS transistors. The layers in fixed region 200 may not be customizable or may not be changed. Hence, the available transistors or base cells may be predetermined and may be pre-fabricated on wafers and may be customized or programmed at later time by customizing layers in programmable region 210. Traditional gate array technology may result in a reduced number of layers compared to standard cell technology since the layers in fixed region 200 would be common in implementing integrated circuit 100.

FIG. 1B illustrates an exemplary layout diagram of two inputs NAND circuit using traditional gate array technology. The most commonly used gate array base cell contains two P-type MOS transistors 21 and two N-type MOS transistors 22. These transistors may be formed with substrate layer 201, diffusion layer 202, and gate electrode layer 203, which are part of fixed region 200 in FIG. 1A. In this illustration, the design connects various P-type MOS nodes to N-type MOS nodes using contact layer 205 and metal layer 211 which are part of programmable region 210 to create the NAND function circuit.

There have been many attempts in metal programmable technology to provide potential advantages for smaller die size and for better performance but still may maintain potential advantage of metal only programmable technology. U.S. Pat. Nos. 5,341,041; 5,289,021; 4,816,887; 5,038,192; and 4,668,972 disclose many different gate array base cell architecture and different size transistors in base cell to enhance gate density (e.g. die size). U.S. Pat. No. 6,617,761 discloses two different types of base cells to increase gate density and elevated metal levels for customization to enhance global routing and time to market problems of standard cell and gate array technology. U.S. Pat. Nos. 7,463,062; 6,985,012; 6,930,511; 6,194,912 discloses metal programmable integrated circuit which may be customized by single via layers with lookup table (LUT) base cells which are common in Field Programmable Gate Array (FPGA). These disclosures may result in a single mask programmable IC, which reduces the mask cost. However, such devices may rely on larger base cells such as LUTs as compared to transitional gate array. Additionally, such devices may not offer the density, power and performance comparable to standard cell technology. U.S. Pat. Nos. 7,870,513 and 4,910,417 disclose various base cells that may contain multiplexors, simple combination logic cells, or inverters to minimize the number of programmable mask layers, but these base cells still do not offer the same density, power, and performance of standard cell technology.

SUMMARY

In a first aspect, systems and methods are disclosed for forming a custom integrated circuit (IC) with a first fixed (non-programmable) region on a wafer with non-customizable mask layers, wherein the first fixed region includes multiplicities of transistors and a first interconnect layer and a second interconnect layer above the first interconnect layer which form base cells; and a programmable region above the first fixed region with customizable mask layers, wherein at least one mask layer in the programmable region is coupled to the second interconnect layer which provides electrical access to all transistor nodes of the base cells and wherein the programmable region comprises a third interconnect layer coupled to the customizable mask layers to customize the IC.

In a second aspect, a custom integrated circuit (IC) includes a first fixed (non-programmable) region on a wafer with non-customizable mask layers, wherein the first fixed region includes multiplicities of transistors and a first interconnect layer and a second interconnect layer above the first interconnect layer which form base cells; and a programmable region above the first fixed region with customizable mask layers, wherein at least one mask layer in the programmable region is coupled to the second interconnect layer which provides electrical access to all transistor nodes of the base cells and wherein the programmable region comprises a third interconnect layer coupled to the customizable mask layers to customize the IC; and a second fixed region above the programmable region to provide multiple fixed regions and reduce the number of required masks in customizing the custom IC.

In a third aspect, a method to fabricate a custom integrated circuit (IC) includes fabricating a first fixed (non-programmable) region on a wafer with non-customizable mask layers and forming a first interconnect layer and a second interconnect layer in one or more base cells of the first fixed region; fabricating a programmable region above the first fixed region with customizable mask layers; fabricating a second fixed (non-programmable) region above the programmable region; electrically coupling at least one customizable mask layer in the programmable region to the second interconnect layer in the first fixed region; and providing full access to all transistor nodes of the base cells to fully customize the IC through the customizable mask layers in the programmable region.

In a fourth aspect, a method to fabricate a custom integrated circuit (IC) includes fabricating a first fixed (non-programmable) region on a wafer with non-customizable mask layers and forming a first interconnect layer and a second interconnect layer in one or more base cells of the first fixed region; fabricating a programmable region above the first fixed region with customizable mask layers; electrically coupling at least one customizable mask layer in the programmable region to the second interconnect layer in the first fixed region; and providing full access to all transistor nodes of the base cells to fully customize the IC through the customizable mask layers in the programmable region.

Implementations of the above aspects may include one or more of the following. The system may provide a set of components, which may include programmable cell arrays, RAM, ROM and/or other functions (IPs), along with a number of layers of interconnect on a single semiconductor integrated circuit device, all of which are customizable through higher interconnect layers (e.g. Via2 and Metal 3 and interconnect layers above, for example) than traditional gate array customizable layers (e.g. Contact and Metal 1 and interconnect layers). The system may provide multiple non-programmable layer regions to further reduce the number of required masks in customization of ASIC or SoC. The system may promote the programmable layers to higher interconnect layers to provide access to all nodes of transistors such as diffusions, gate electrodes which may be included in base cell to achieve enhanced density and performance compared to other metal programmable technologies with larger base cell such as LUT or other structure ASIC base cell. A variable region may be used where certain programmable layers and fixed layers selected based on interconnect requirement to provide even higher layer programmability by promoting programmable layers to be higher layers when compared to standard cell or gate array technology.

Potential advantage of the preferred embodiments may include one or more of the following. The system may reduce mask cost in ASIC or SoC with many IPs and multiple intrinsic metal layers, while still allowing time to market, performance and density of standard cell technology. Those features are achieved while maintaining the advantages of metal programmable technology. Moreover, the use of higher interconnect layers and said features may result in one or both of performance advantages and unit cost advantages over currently available FPGAs and may also provide tooling cost advantage over traditional gate array and standard cell solutions by reducing the number of required masks. The use of higher interconnect layers and said features provides gate density and performance comparable to standard cell technology may result from the enhanced routability by empty tracks and multiple track ports.

The above aspect of the invention together with others and the novel features will become fully clear from reading the following preferred embodiments in the light of the accompanying drawings. However, the drawings are solely for the purposes of explanation, and the invention is not restricted thereby.

BRIEF DESCRIPTION OF THE DRAWINGS

Preferred exemplary embodiments of the present invention will be described in detail based on the following figures, wherein:

FIG. 3 illustrates a generalized stack of layers that may be used to fabricate the custom IC.

FIG. 4 illustrates one exemplary stack of layers that form a programmable region sandwiched between two fixed regions.

FIG. 9 illustrates yet another embodiment where the integrated circuit includes a variable programmable region with one or more programmable layers and one or more fixed layers or any combination of thereof.

DESCRIPTION

In the following description, numerous specific details are set forth in order to provide a thorough understanding of the invention. It will be apparent, however, to one skilled in the art that the invention may be practiced without some or all of these specific details. In other instances, well known process operations have not been described in detail in order to unnecessarily obscure the present invention.

Figure 2:
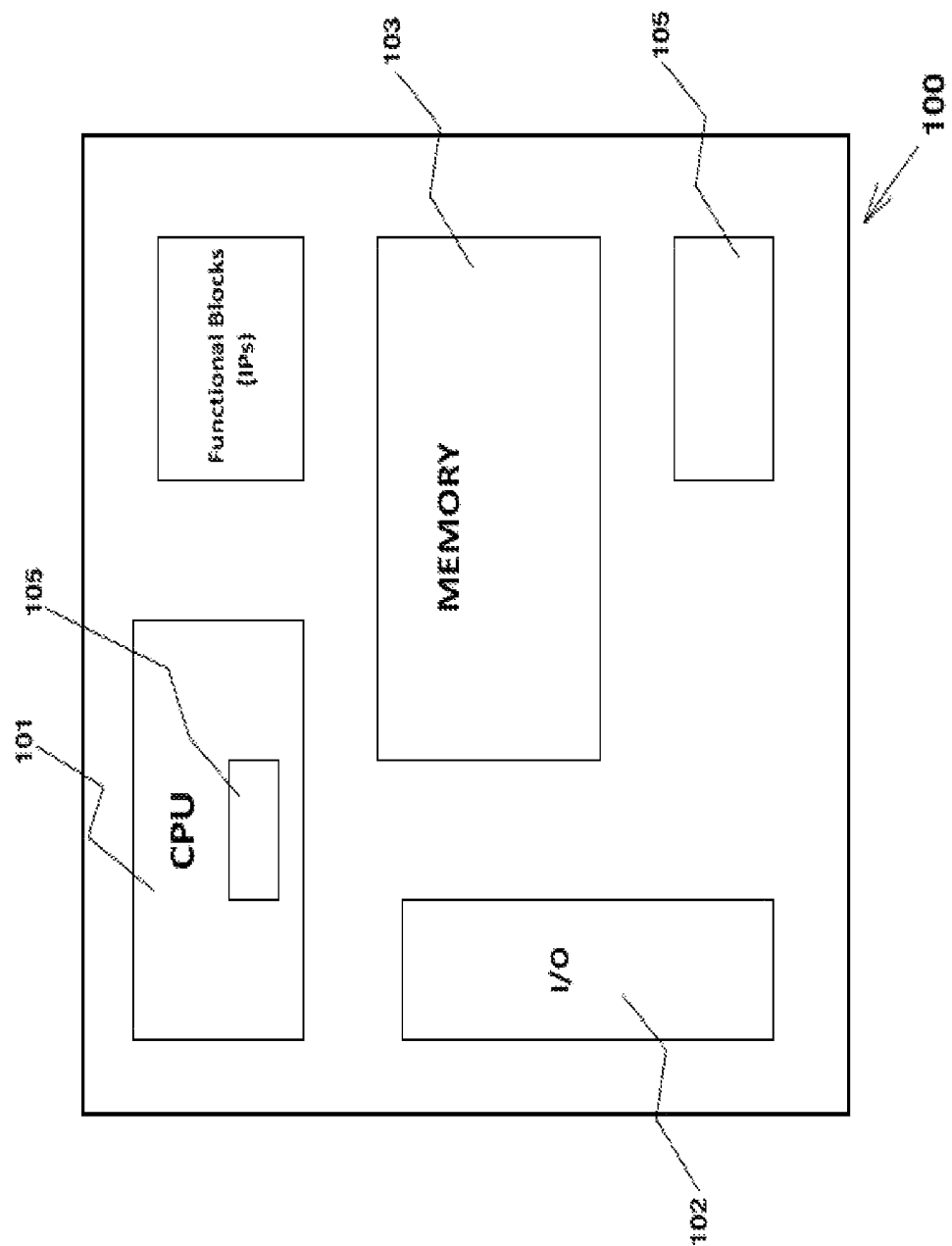
FIG. 2 illustrates an exemplary custom highly integrated circuit (IC) in accordance with one aspect of the invention.

FIG. 2 illustrates an exemplary custom highly integrated circuit (IC) 100 in accordance with one aspect of the invention. The integrated circuit 100 may contain one or more central processing units (CPUs) 101 which may be microprocessors, microcontrollers, state machines, or other suitable processing units. The integrated circuit 100 may also contain multiplicities of Inputs and Outputs (I/Os) 102 which may be used to transfer data or signals between IC 100 and other ICs in the system. The IC 100 may also contain multiplicities of memories 103 which may be random access memories (RAMs), read-only-memories (ROMs), Register Files, or other types of memories. The IC 100 may also contain integrated circuit 105 embodying the invention and may be included in CPU 101 as illustrated in FIG. 2 as an element of CPU 101. Similarly, multiplicities of integrated circuit 105 may be included in any or all of the functional circuit blocks. Moreover, the functional circuit blocks (or IPs) illustrated in FIG. 2 may be realized by using different technologies such as standard cell, full custom or metal programmable technologies and these functional blocks may contain intrinsic interconnect layers that are part of the functional blocks and may not be customizable. For example, one of the memories 103 may be full custom memory (RAM) and may contain multiplicities of CMOS transistors and intrinsic interconnect layers that are part of the memory and may not be customizable or may not be changed. When an integrated circuit 100 is created with multiplicities of integrated circuit 105 and memories 103 with up to metal3 intrinsic interconnect layers, the integrated circuit 105 may require five or more metal layers with their via layers to potentially achieve reasonable routability and die size. The additional two or more layers may be required because the memories already may have up to metal3 in this example and in order to make signal connection over the memories at least two additional interconnect metal layers and their via layers may be needed. For example, the signal connection or routing over the memories with up to metal3 intrinsic layers may be accomplished by utilizing metal4, via4 and metal5 layers, among others. In this example all five metal layers and their via layers may be needed for customization using traditional gate array, but one of embodiment of the invention may only require 3 metal layers and their via layers for customization and provide potential advantages of reduced mask cost and shorter manufacturing time.

FIG. 3 illustrates a generalized stack of layers that may be used to fabricate the IC 100. It should be appreciated that the generalized stack of layers described in FIG. 3 is not intended to represent an exhaustive description of the CMOS manufacturing process. However, the integrated circuit 105 may be built in accordance with standard CMOS manufacturing process. Even though some embodiments are described in the context of a CMOS process with n-well and p-substrate, it is easily comprehended by one of skill in the art that this concept is applicable to all variations of CMOS technology such as triple-well CMOS or SOI (Silicon-On-Insulator).

Turning now to FIG. 3, substrate 201, diffusion layer 202 and gate electrode layer 203 may be used to form multiplicities of P and N type MOS transistors. Further, contact layer 205, metal1 layer 211, via1 layer 212 and additional interconnect layers may be used to create integrated circuit 100. In today's CMOS process technology, up to 10 metal and via layers are commonly used to create IC 100. In standard cell technology all the layers illustrated in FIG. 3 may be customizable and may contain unique patterns for each layer for the IC 100 hence requiring unique set of masks.

In metal programmable technology, two different regions may contain multiple interconnect layers (e.g., metal layers and via layers). One of the regions may be fixed (non-programmable) region where the mask layers in this region may be fixed and non-customizable while a second region may be a programmable region where the mask layers in this region may be customized to create design specific integrated circuits.

As shown in FIG. 4, the preferred embodiment potentially reduces the number of masks in the programmable region while provides transistor level customization using only the mask layers in the programmable region. A variable programmable region above the fixed region may be used to provide flexibility in implementing integrated circuit with multiplicities of functional blocks or intellectual properties (IPs) that may have intrinsic interconnect layers. The system of FIG. 4 reduces the presence of customizable layers by fixing interconnect layers (another fixed region) above the programmable region, which may contain additional mask layers that could potentially be used for power and ground distribution network, clock network and global signal network such as system reset, test mode and test enable, for example.

FIG. 4 illustrates one exemplary stack of layers used to manufacture integrated circuit 100 according to various embodiments of the invention. The embodiments of FIG. 4 increase the number of layers in fixed region 300 and allow the programmable layers to move to higher interconnect layers into programmable region 310, hence reducing number of masks required to create IC 100. IC 100 may contain multiplicities of integrated circuit 105 and functional blocks with intrinsic interconnect layers that may not be customizable as the previous memory (RAM) example with intrinsic interconnect layer up to metal3.

Figures 1A, 1B:
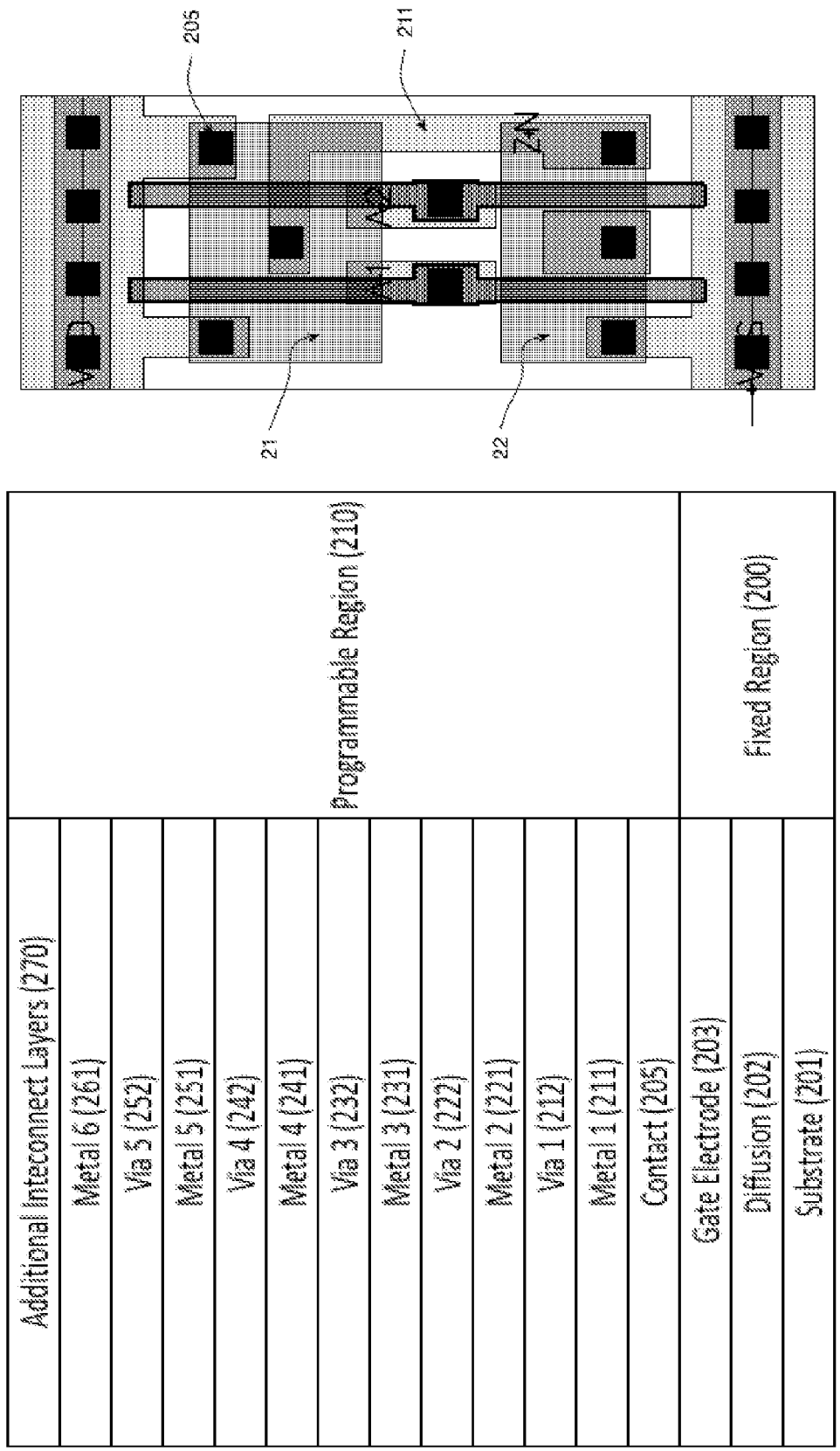
FIGS. 1A-1B show exemplary conventional gate array structures.

In the example of FIG. 4, the fixed region 300 includes contact layer 205, metal1 layer 211, via1 layer 212, and metal2 layer 221 in addition to fixed region 200 illustrated in FIG. 1A for the case of traditional gate array technology. Various embodiments may increase the number of fixed layers and reduce number of customizable layers to reduce tooling cost and manufacturing time by holding pre-fabricated wafers of IC 100 at Metal2 layer 221 for design specific customization at later time.

In FIG. 4, IC 100 may also provide additional fixed region 320 above programmable region 310 to further reduce programmable layers. The additional fixed region 320 may contain via5 layer 252 and metal6 layer 261 and additional interconnect layers 270, which may be used for power distribution network, clock network and global signal network such as system reset, test mode and test enable, for example.

FIGS. 5A-5E illustrate various preferred embodiments to create an integrated circuit 105 by using one or more layers in the programmable region 310. The circuit 105 also may have layers in fixed region 300 to be predefined and pre-fabricated to reduce mask cost and manufacturing time.

Figure 5B:
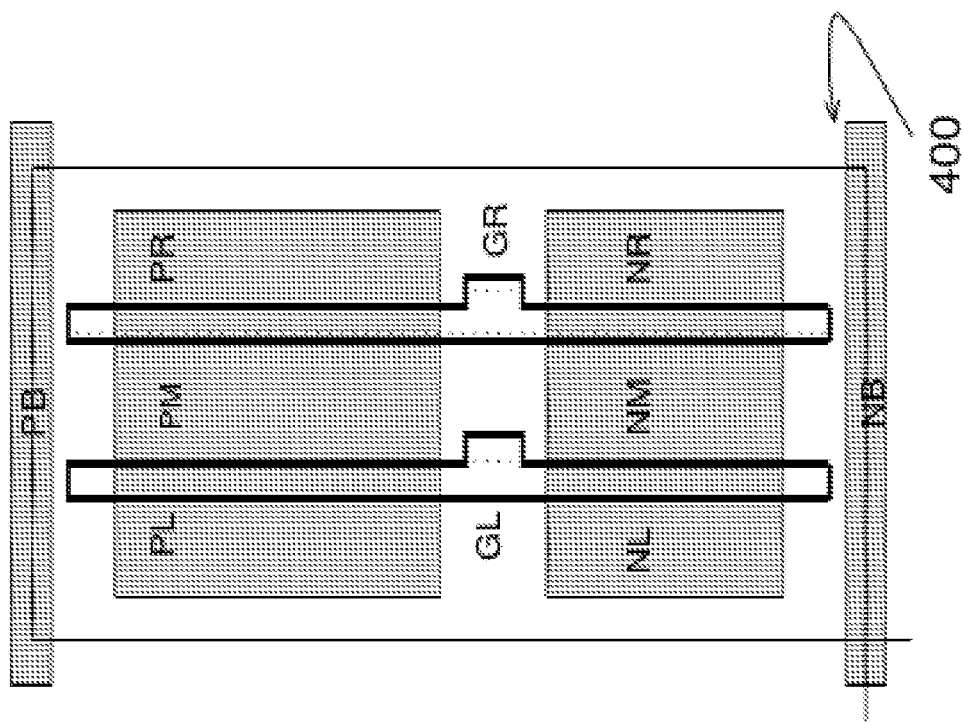
FIGS. 5A-5E illustrate some preferred embodiment of a base cell with interconnect layers in fixed region
Figure 5A:
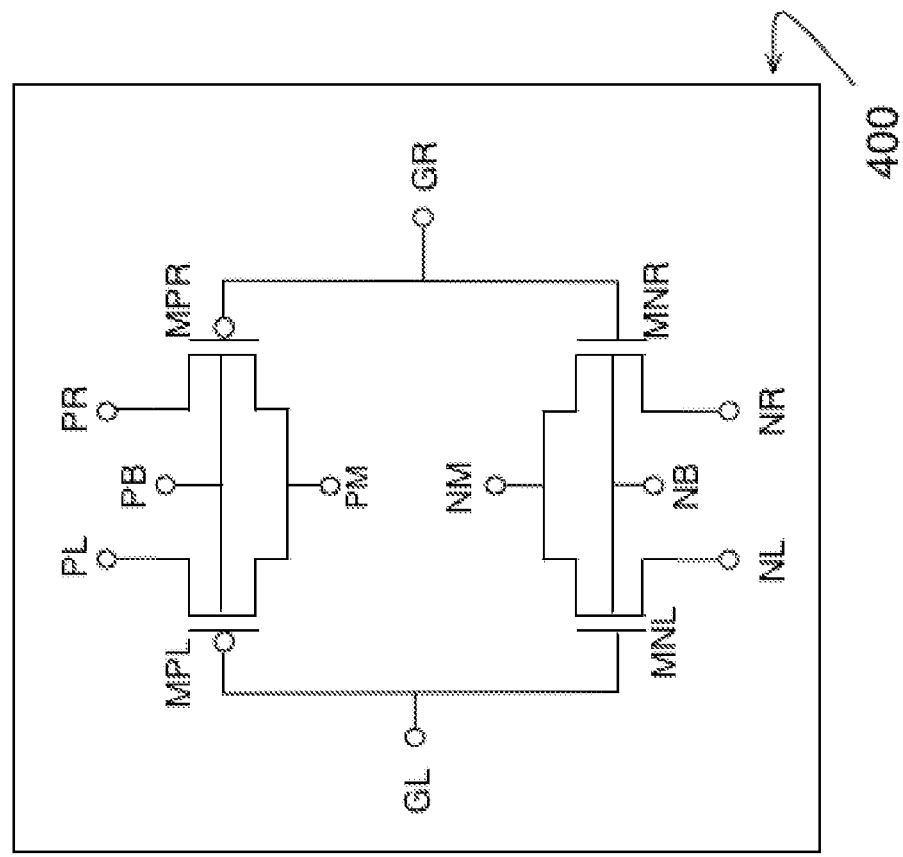

FIG. 5A shows a schematic diagram of one embodiment with exemplary base cell 400, which in this example contains four MOS transistors. The base cell may also contain six or more MOS transistors in other embodiments. The base cell has 2 p-type MOS transistors and 2 n-type transistors. The MPL and MPR are p-type transistors and the left p-type transistor MPL and the right p-type transistor MPR have common drain node PM and they are connected. The source node of the left p-type transistor MPL is labeled PL and the source node of the right p-type transistor MPR is labeled PR. Similarly the MNL and MNR are n-type MOS transistors and the left n-type transistor MNL and the right n-type transistor MNR have common drain node NM. The source node of the left N-type transistor MPL is labeled NL and the source node of the right N-type transistor MNR is labeled NR. The PB, which is body node for p-type transistors, and NB, which is body nodes for n-type transistors are also illustrated. Every body, source, drain and gate node may be promoted to a higher level (e.g. Metal 2 layer) and to be programmed by layers in programmable region 310.

FIG. 5B illustrates an exemplary layout diagram of base cell 400 equivalent to schematic diagram FIG. 5A. The gates of MPL and MNL transistors are connected through gate electrode and labeled GL. Similarly the gates of MPR and MNR transistors are connected through gate electrode and labeled GR. FIG. 5B also illustrates that every body, source, drain and gate nodes, which may be promoted to the higher level (e.g. metal2) and programmed by layers in programmable region 310.

Figure 5E:
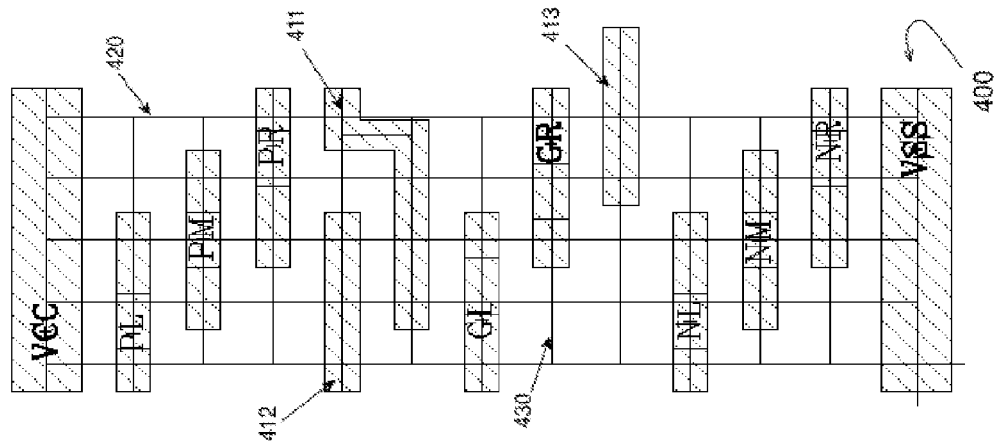
Figure 5C:
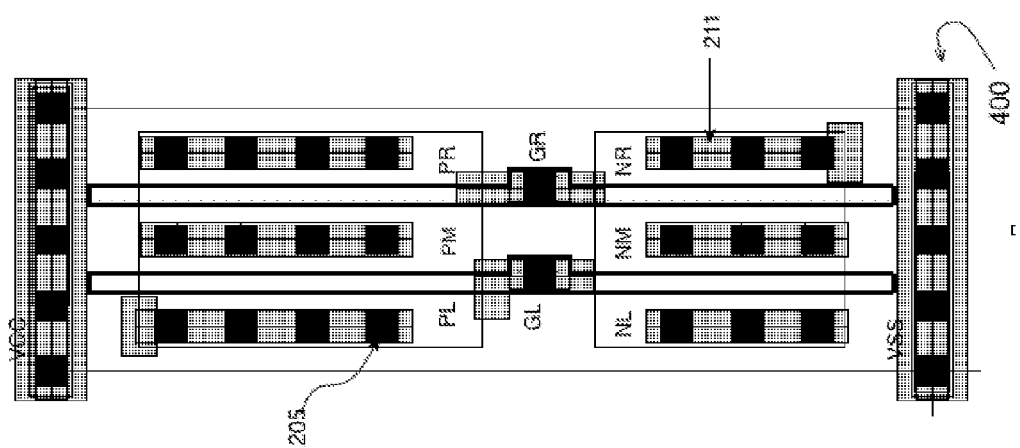

FIG. 5C illustrates an exemplary layout diagram of base cell 400 as illustrated in FIG. 5B and further illustrates contact layer 205 and metal1 layer 211 which may be part of the fixed region 300. In conventional standard cell technology and gate array technology, contact layer 205 and metal 1 layer 211 are used to make connections to different nodes of transistors to create predetermined functions as illustrated in FIGS. 1A-1B. In the embodiment of FIG. 5C, the contact layer 205 and metal1 layer 211 may be used primarily to provide conduction paths to upper metal2 layer 221 for all transistor nodes.

In various embodiments, the metal1 traces for gate and diffusion nodes would be positioned primarily in the same direction (in parallel) to the gate electrode direction (y-direction). In this diagram the gate electrode layer 203 runs primarily in vertical direction and the metal1 traces for all transistor nodes except the body nodes may be in vertical direction. Yet another embodiment of the invention, metal1 trace for power node (VCC) may be orthogonal to gate electrode direction and makes connection to body nodes of p-type transistors. The metal1 trace for ground node (VSS) may be also orthogonal to gate electrode direction and makes connection to body nodes of n-type transistors.

Figure 5D:
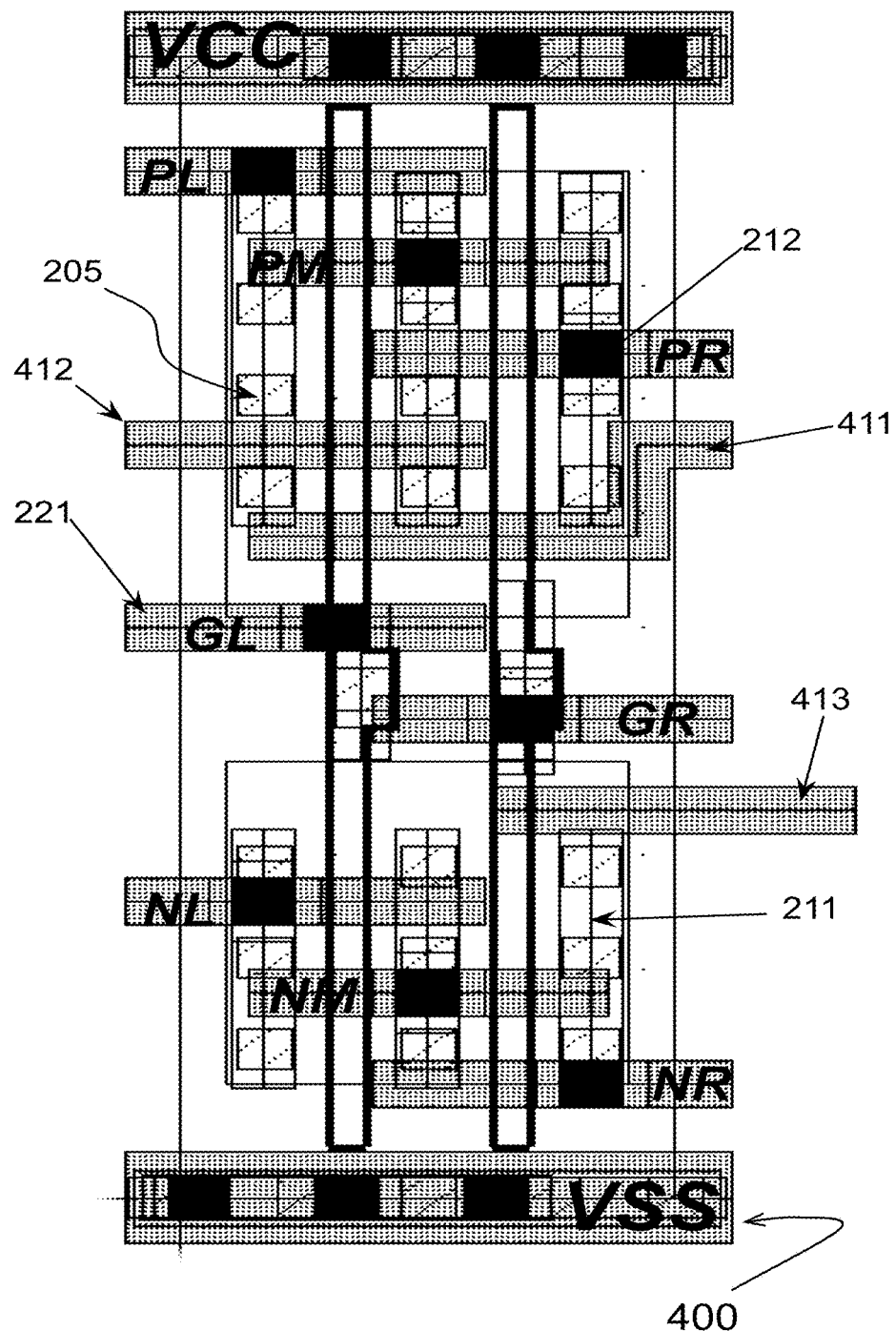

FIG. 5D illustrates an exemplary layout diagram of base cell 400 as shown in FIG. 5C and further illustrates via1 layer 212 and metal2 layer 221 in fixed region 300. The metal2 traces may be orthogonal to metal1 layers except the power (VCC) and ground (VSS) traces. In one implementation, the power (VCC) and ground (VSS) metal2 traces are provided on top of metal1 traces and are connected with via1 layer 212 to increase the current carrying capability while potentially facilitate simpler power and ground connection when customizing the base cell 400 to create cells with different functionality using programmable region 310.

Yet another embodiment of the invention the base cell 400 may include multiplicities of metal2 221 traces that may have no connection to any transistor nodes and to be used as feedthrough for higher-level signal connection. In FIG. 5D, the metal2 traces 411, 412 and 413 are feed-through traces that may be used to form different cell functions at higher interconnect layers and they may facilitate horizontal signal connection from one base cell to one or more base cells. As illustrated in FIG. 5D every transistor nodes shown FIG. 5A are promoted (made available or electrically accessible) to metal2 layer 221 and may be used to create cells with different functionality using layers in programmable region 310.

FIG. 5E shows a simplified layout diagram of FIG. 5D, which illustrates only metal2 layer with corresponding nodes brought up from every transistor nodes shown in FIG. 5A. FIG. 5E also illustrates vertical tracks 420 which may be used by metal3 layer 231 and metal5 layer 251 and horizontal tracks 430 which may be used by metal4 layer 241 and metal6 layer 261 and these tracks may be at minimum metal pitches for corresponding layers based on metal and via spacing and width design rules for manufacturing.

According to one embodiment, the metal2 layer 221 could have a preferred horizontal direction and metal3 layer 231 could have a preferred vertical direction, which would be orthogonal to preferred direction of metal2 layer 221. Similarly, metal4 layer 241 may have preferred horizontal direction and metal5 layer 251 may have preferred vertical direction, which would be orthogonal to preferred direction of metal4 layer 241 and same preferred direction of metal2 layer 221.

According to another embodiment, the metal2 traces may have different shapes and length as illustrated with metal2 traces 411 and 412. The metal2 traces cover more than one vertical routing tracks, which vertical traces from other layers (e.g. metal3, metal5) may use, to simplify layout in creating different functional circuits and provide one or more empty tracks (e.g. free of metal traces for the layer) to increase gate utilization density.

According to yet another embodiment of the invention, the metal2 traces for power VCC and ground VSS may have same or different widths compared to other metal2 traces of base cell 400 and may have same or different spacing (pitch) compared to other metal2 traces. The potential advantage of this embodiment may provide enhanced flexibility in designing power and ground distribution network and may provide potential advantages in reducing frequency of power connections using programmable region metal layers 310 hence may produce better routability and gate utilization.

According to further embodiments of the invention, the base cell 400 may be used to form multiplicities of functions such as inverter, buffer, NAND, NOR, flip-flops, latches, multiplexor and other functional circuits utilizing only layers from programmable region 310.

Figure 6A:
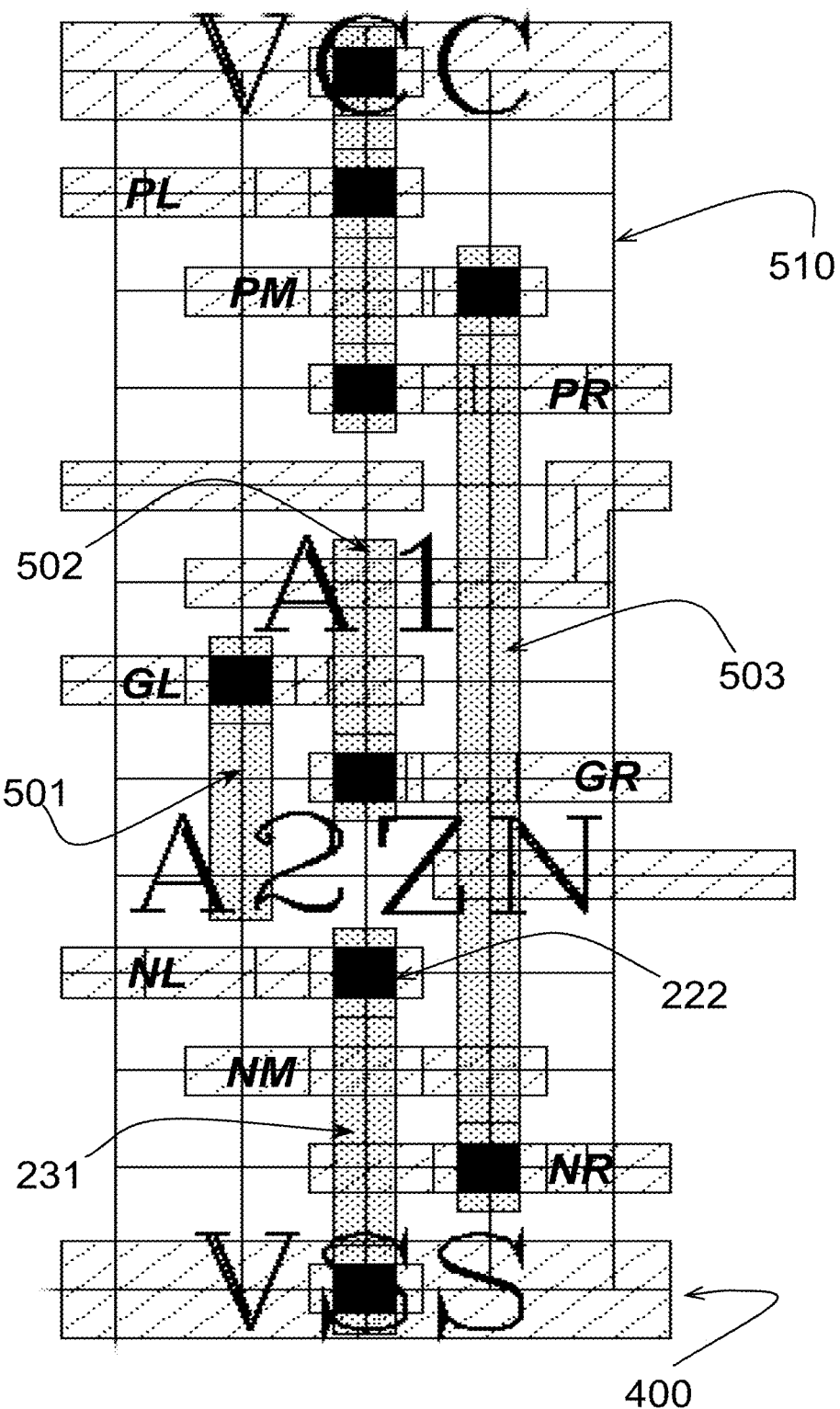
FIGS. 6A-6C illustrate exemplary layout diagrams of an integrated circuit with programmable regions.

FIG. 6A illustrates exemplary layout diagram of two inputs NAND circuit according to certain embodiments of the invention with one base cell 400 only using via2 layer 222 and metal3 layer 231 from programmable region 300 to create NAND function circuit. The metal2 traces of base cell 400 may cover more than one vertical tracks and may be arranged to provide simpler transistor node connections, hence the resulting layout may have potentially reduced number of vertical metal tracks occupied and may provide one or more empty vertical tracks (without same layer metal traces) available for creating integrated circuit 100 compared to traditional gate array.

Figure 6B:
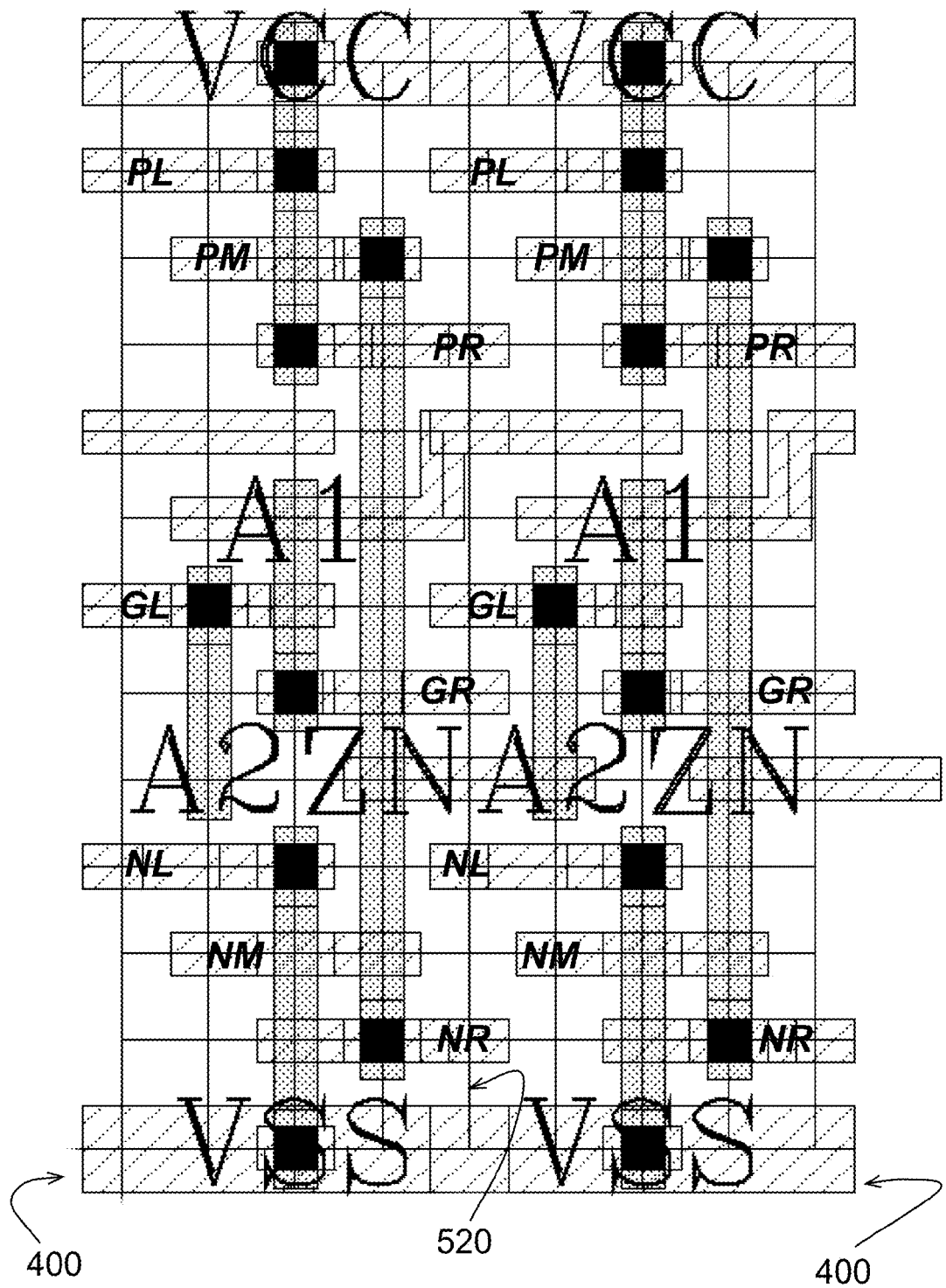

Referring now to the example in FIG. 6A, only 3 metal3 vertical tracks out of 4 may be used to create NAND function. Thus, the device may have 1 empty metal3 vertical track 510 (free of metal3 trace) available for implementation of integrated circuit 100. Said potential advantage may be illustrated with FIG. 6B where two different two input NAND circuits are placed next to each other. In this example, the vertical track 520, which is vertical track 510 in FIG. 6A, are free of metal3 traces and are available for signal connections in implementing integrated circuit 100.

Turning now to FIG. 6A, another illustrative advantage of some embodiments may be the metal3 traces for A2 port 501 and ZN port 503 are free of other metal3 traces (accessible) in vertical direction of the port hence may provide potential connections using metal3 to these ports and may potentially enhance routability and gate utilization density in implementing integrated circuit 100. Other advantages of the embodiment of FIG. 6A are that A1, A2 and A3 metal3 ports may cover multiplicities of horizontal tracks and may provide potentially enhanced signal connection since automatic signal router may chose most optimal horizontal routing track for signal connection without jog or changing direction with multiple metal layers and via layers in implementing integrated circuit 100. For example, the port ZN 503 covers 10 horizontal routing tracks which the automatic signal router may choose from to provide short and straight signal connection (e.g. in metal4) without jog or changing direction with multiple metal layers and via layers.

Figure 6C:
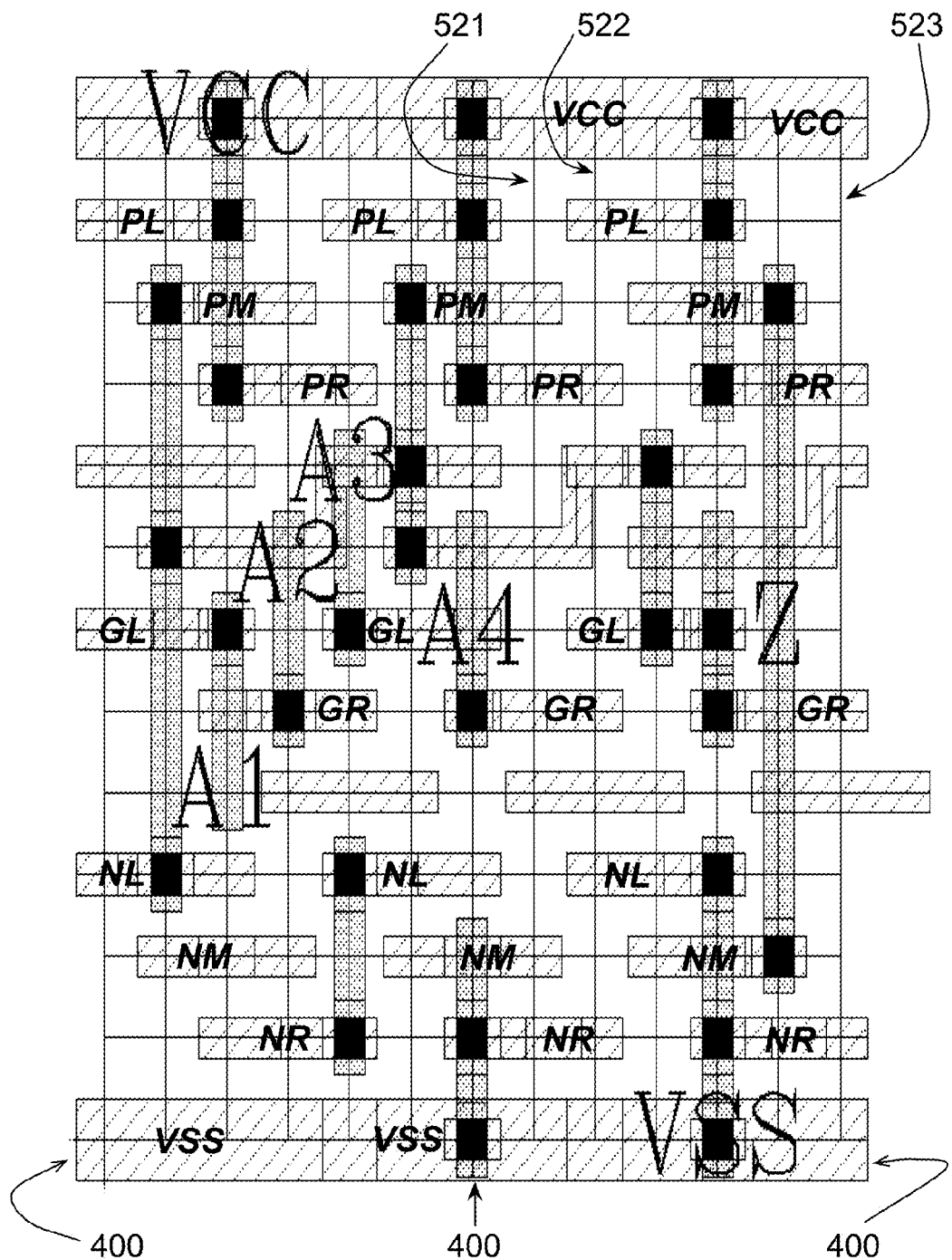

FIG. 6C illustrates layout diagram of 4 input AND circuit that may be created by 4 input NAND connected to an inverter using 3 base cell 400 and further illustrates there may be one or more empty metal3 vertical tracks available for later use. The vertical tracks 521, 522, 523 are empty and free of metal3 traces hence provide potentially enhanced signal connections in implementing integrated circuit 100. According to embodiments of the invention the functional circuits, which may be implemented with more than one base cells 400, may potentially have more than one empty metal3 vertical tracks hence with better routability and higher gate utilization.

Figure 7:
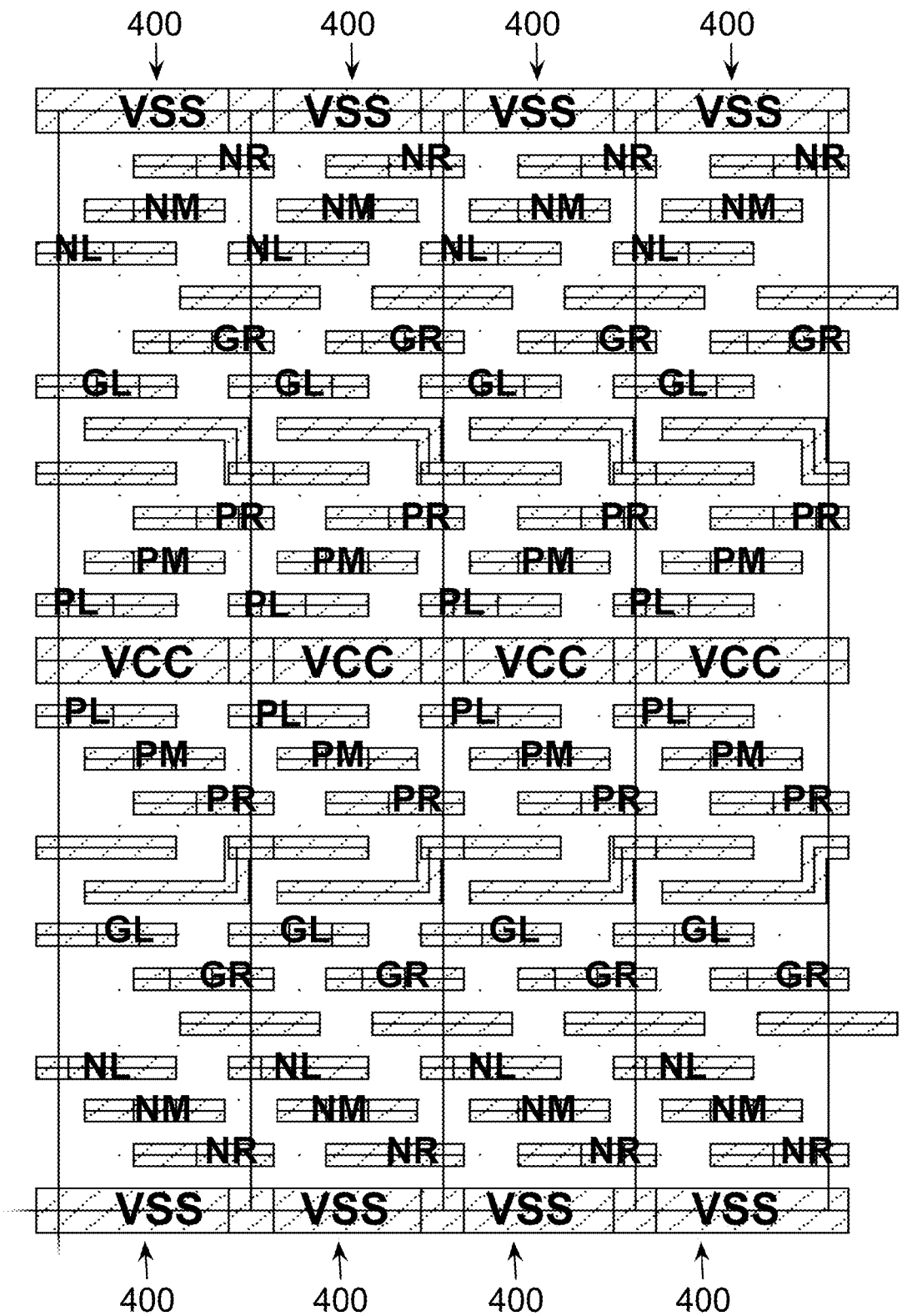
FIG. 7 illustrates another exemplary integrated circuit layout with multiplicities of base cells.

FIG. 7 illustrates another exemplary integrated circuit 105 with multiplicities of base cell 400. The exemplary IC contains 4 by 4 array of base cell 400 with only metal2 layers as shown in FIG. 5E. In accordance with one embodiment, the multiplicities of base cell 400 may be arranged in rows and the alternate rows may have symmetry around x-axis (e.g. mirrored about x-axis) in order to share power (VCC) or ground (VSS) buses. Although the specific embodiments may have base cell 400 arranged in rows, other embodiments might have the base cell 400 arranged in columns.

Figure 8B:
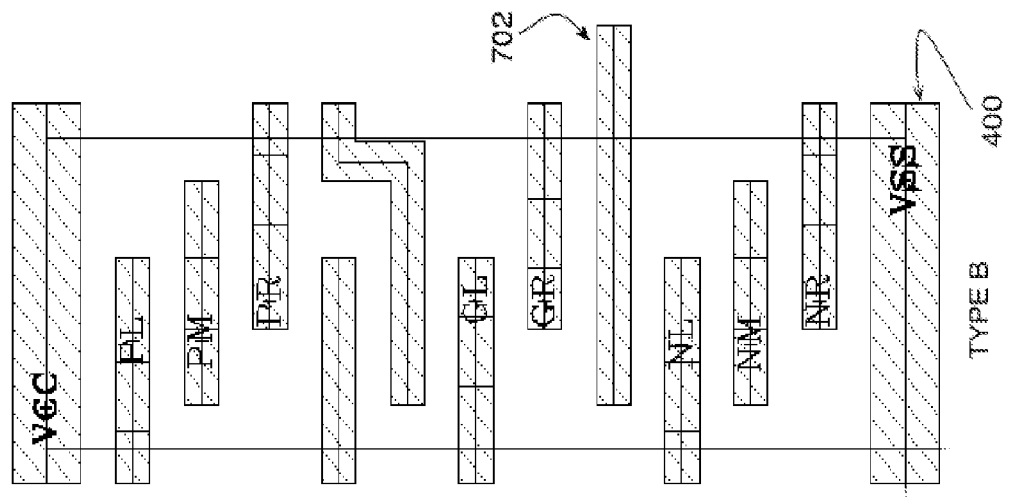
FIGS. 8A-8C illustrate various integrated circuit layout examples with different types of base cells.
Figure 8A:
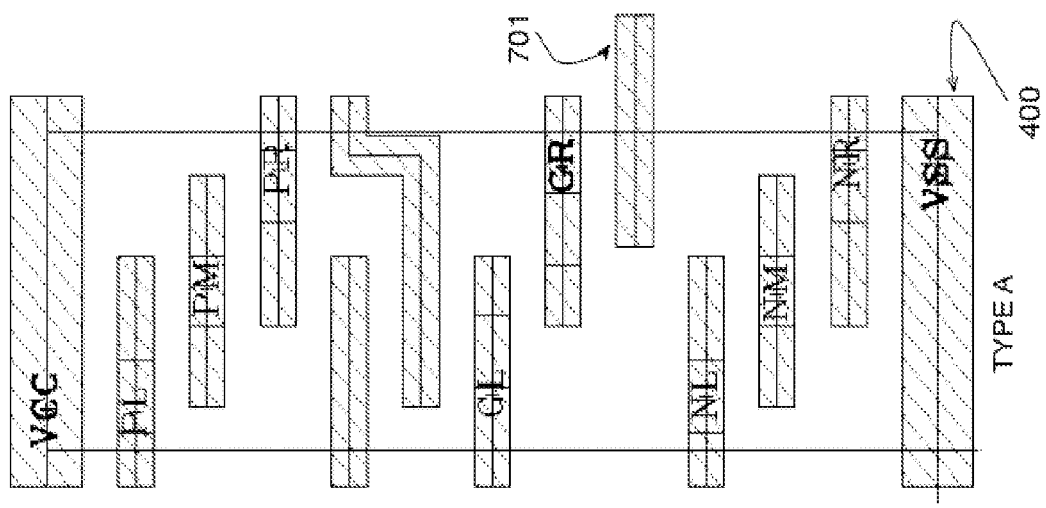

Other embodiments of the invention may have one or more different types of base cell 400 to further facilitate layout of functional blocks. FIGS. 8A and 8B illustrate exemplary base cells that may have different metal2 trace patterns while may have same base cell 400 illustrated FIG. 5C.

For example the FIG. 8A may be the first type (TYPE A) of base cell 400 with metal2 patterns same as the FIG. 5E. The FIG. 8B may be the second type (TYPE B) of base cell 400 with metal2 patterns that may be different compared to FIG. 5E and there may be one or more different metal2 patterns. FIG. 8B may be such an example and the second type of base cell 400 contains one metal2 trace 702, which may be different than metal2 trace 701 in FIG. 8A.

Figure 8C:
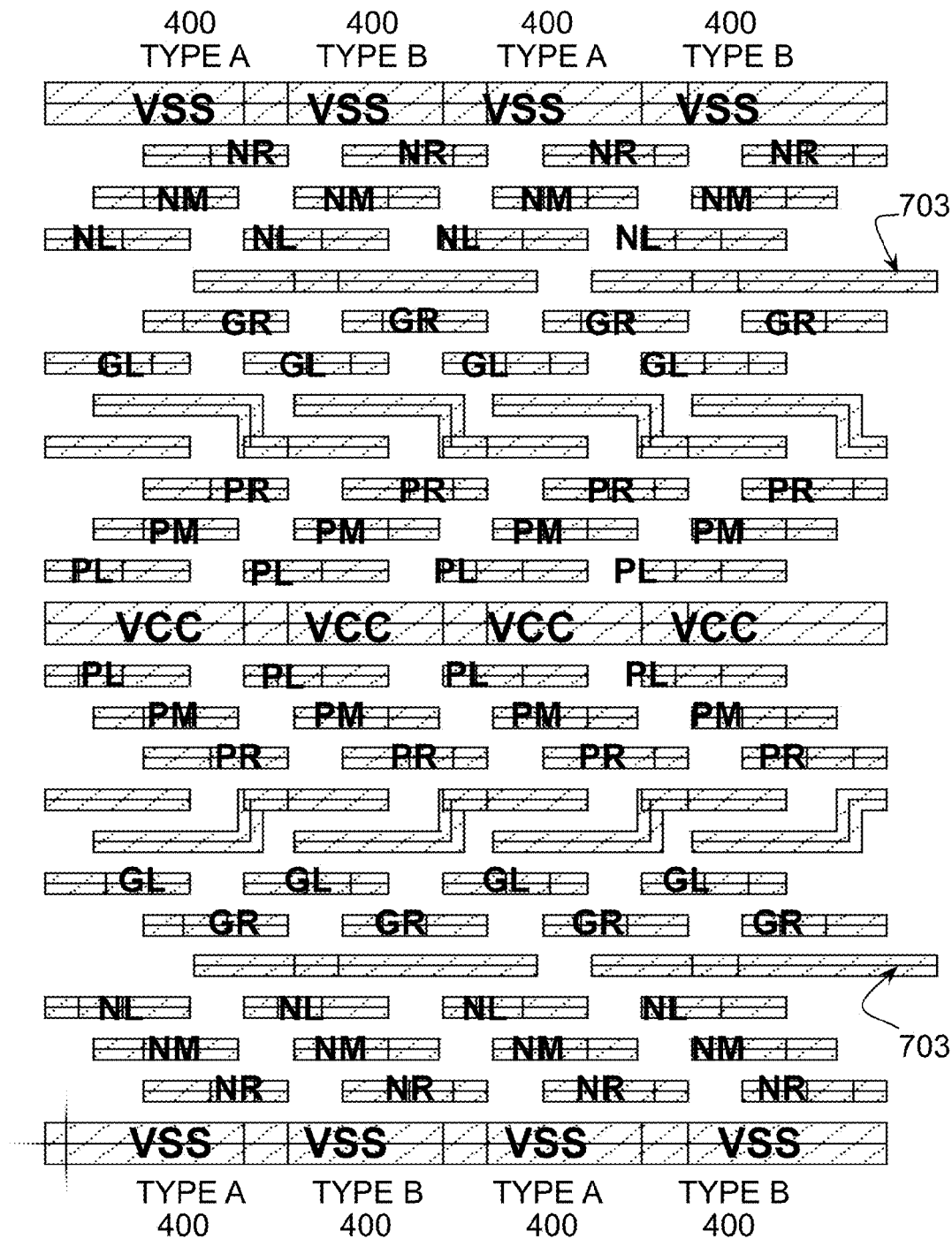

FIG. 8C illustrates another embodiment of integrated circuit 105 which contains multiplicities of first and second type of base cell 400. The exemplary figure contains 4 by 4 array of base cell 400 of both types. The embodiment is advantageous in that it leads to longer metal2 trace 703 which may provide easier layout for creating large cell functions and may contain large number of base cell 400 to be connected.

FIG. 9 illustrates yet another embodiment where the integrated circuit 100 includes variable programmable region 890 with one or more programmable layers and one or more fixed layers or any combination of thereof. The fixed region 800 may be same as previously described and may be used to create integrate circuit 105 by using programmable region 810. However, in order to create integrated circuit 100 with multiplicities of functional blocks with various intrinsic metal layers, in some cases there may be needs for additional interconnect layers. Therefore the embodiments of FIG. 9 may utilize the increased number of fixed layers 800 and may utilize programmable region 810 in creating integrated circuit 105, and additionally may add additional programmable and fixed layers based on interconnect requirements for integrated circuit 100 and further minimize number of programmable interconnect layers.

One of ordinary skill in the art will realize that the foregoing description is illustrative only and is not intended to be in any way limiting. Other embodiments of the invention will readily suggest themselves to such a skilled person from an examination of the within disclosure.

While a preferred embodiment has been set forth along with modifications and variations to show specific advantageous details of the present invention, further embodiments, modifications and variations are contemplated within the broader aspects of the present invention, all as set forth by the spirit and scope of the following claims.

What is claimed is:

1. A custom integrated circuit, comprising:
   a first fixed, non-programmable region comprising at least one non-mask-customizable layer, wherein the first fixed region comprises a plurality of base cells, each base cell comprising a plurality of transistors and at least a first interconnect layer comprising a first plurality of parallel traces; and
   a programmable region above the first fixed region comprising at least one mask-customizable layer, wherein at least one layer in the programmable region is coupled to the first interconnect layer so as to provide electrical access to all transistor nodes of the base cells, and wherein the programmable region comprises a at least a second interconnect layer coupled to the mask-customizable layer for customizing the integrated circuit, the second interconnect layer consisting essentially of a second plurality of traces orthogonal to the first plurality of traces and spaced apart according to a regular arrangement of routing tracks; wherein, for each base cell:
   the first plurality of parallel traces comprises, for each of the plurality of transistors, at least one trace corresponding to that transistor only and extending for a length of at least three adjacent routing tracks; and
   the first plurality of parallel traces are positioned such that a single routing track passes through a plurality of traces comprising at least one trace corresponding to each of the plurality of transistors.

2. The custom integrated circuit of claim 1, comprising a second fixed region above the programmable region for reducing a number of required masks in customizing the custom integrated circuit.

3. The custom integrated circuit of claim 1, wherein the programmable region comprises at least a via layer and a third interconnect layer.

4. The custom integrated circuit of claim 1, comprising one or more components formed in the fixed and programmable regions, the components being selected from a group consisting of: a programmable cell array, memory, a custom function cell, and an intellectual property cell.

5. The custom integrated circuit of claim 1, comprising a set of components and one or more further interconnect layers, wherein the set of components are mask-customizable by a third interconnect layer in the programmable region to create a system on chip or an application specific integrated circuit.

6. The custom integrated circuit of claim 1, comprising a first component and a second component that exhibit a height difference, further comprising a variable region to fill the height difference, wherein one or more programmable layers are promoted to a higher level interconnect layer in the programmable region based on an interconnection requirement.

7. The custom integrated circuit of claim 2, wherein the second fixed region comprises one or more additional interconnect layers forming at least one of: a power distribution network; a clock network; and a global signal network comprising at least one of a system reset signal, a test mode signal and a test enable signal.

8. The custom integrated circuit of claim 1, wherein each base cell comprises four transistors including two p-type MOS transistors and two n-type MOS transistors.

9. The custom integrated circuit of claim 1, wherein each base cell comprises six or more transistors.

10. The custom integrated circuit of claim 1, comprising one or more traces for gate and diffusion nodes extending primarily in a first direction in parallel to a gate electrode direction.

11. The custom integrated circuit of claim 1, comprising one or more power node and ground node traces orthogonal to a gate electrode direction for making connection to body nodes of p-type transistors and to body nodes of n-type transistors, respectively.

12. The custom integrated circuit of claim 1, comprising power and ground traces formed on top of traces within the non-programmable region and connected with a first via layer to increase current carrying capability.

13. The custom integrated circuit of claim 1, wherein power and ground traces have a different width compared to other traces in the non-programmable region.

14. The custom integrated circuit of claim 1, wherein power and ground traces have a different spacing compared to other traces in the non-programmable region.

15. The custom integrated circuit of claim 1, wherein traces of the base cells are arranged to provide one or more routing tracks accessible to the programmable region that are free of other traces thereby enhancing routability.

16. The custom integrated circuit of claim 1, comprising in the programmable region traces forming connection ports each having a length that is more than one half a greatest dimension of the base cells, for providing enhanced connection to reduce jogging of traces or reduce changing signal routing directions using multiple layers.

17. A custom integrated circuit, comprising:
a first fixed, non-programmable region comprising at least one non-mask-customizable layers, wherein the first fixed region comprises a plurality of base cells, each base cell comprising a plurality of transistors and at least a first interconnect layer comprising a first plurality of parallel traces;
a programmable region above the first fixed region comprising at least one mask-customizable layers, wherein at least one layer in the programmable region is coupled to the first interconnect layer so as to provide electrical access to all transistor nodes of the base cells and wherein the programmable region comprises at least a second interconnect layer coupled to the mask-customizable layers for customizing the integrated circuit, the second interconnect layer consisting essentially of a second plurality of traces orthogonal to the first plurality of traces and spaced apart according to a regular arrangement of routing tracks; and
a second fixed region above the programmable region for reducing a number of required masks in customizing the custom integrated circuit; wherein:
the first plurality of traces comprises, for each of the plurality of transistors, at least one trace corresponding to that transistor only and extending for a length of at least three adjacent routing tracks; and
the first plurality of traces are positioned such that a single routing track passes through a plurality of traces comprising at least one trace corresponding to each of the plurality of transistors.

18. A customizable integrated circuit comprising an array of identically-sized abutting cells, each cell of the array comprising:
a fixed diffusion layer defining a plurality of transistors arranged in an array;
a contact layer providing contact to the transistors;
a fixed layer overlying the contact layer and comprising a first plurality of parallel traces;
a via layer overlying the fixed layer; and
a mask programmed layer consisting essentially of a second plurality of parallel traces orthogonal to the first plurality of traces of the fixed layer, second first plurality of parallel traces being spaced apart according to a regular arrangement of routing tracks; wherein:
the layers together are configured according to any one of a plurality of possible configurations such that connection is established between the mask programmed layer and each transistor of the plurality of transistors or any desired subset thereof;
the first plurality of parallel traces of the fixed layer comprises, for each of the plurality of transistors, at least one trace corresponding to that transistor only and extending for a length of at least three adjacent routing tracks; and
the first plurality of parallel traces are positioned such that a single routing track passes through a plurality of traces comprising at least one trace corresponding to each of the plurality of transistors.

19. The apparatus of claim 18, wherein the fixed layer further comprises a third plurality of traces not connected to any transistor, and wherein the mask programmed layer and the via layer are configured to connect one of the second plurality of traces of one cell of the array with one of the second plurality of traces of another cell of the array through at least one of the third plurality of traces.

* * * * *